United States Patent [19]

Grochowski et al.

[11] Patent Number: 4,985,640
[45] Date of Patent: Jan. 15, 1991

[54] APPARATUS FOR GENERATING COMPUTER CLOCK PULSES

[75] Inventors: Edward Grochowski, San Jose; Rajesh Gupta, Sunnyvale, both of Calif.

[73] Assignee: Intel Corporation, Santa Clara, Calif.

[21] Appl. No.: 472,598

[22] Filed: Apr. 4, 1990

[51] Int. Cl.$^5$ .................... H03K 5/13; H03K 3/017
[52] U.S. Cl. .................... 307/269; 307/265; 307/605; 307/603; 328/63; 328/55
[58] Field of Search ............... 307/269, 265, 605, 606, 307/603, 480; 328/63, 72, 55

[56] References Cited

U.S. PATENT DOCUMENTS 4,604,582  8/1986  Strenkowski et al. ............... 307/269

*Primary Examiner*—Timothy P. Callahan
*Attorney, Agent, or Firm*—Blakely, Sokoloff, Taylor & Zafman

[57] ABSTRACT

A circuit for generating a pair of clock pulses of opposite phases each having the same frequency as the frequency of an input signal generated by a crystal oscillator including apparatus for generating first and second pair of signals at half the frequency of the input signal generated by a crystal oscillator, the signals of each pair being of opposite phase to one another; apparatus for comparing a first signal of the first pair signals with the one of the signals of the second pair of signals which is normally out of phase therewith to produce an output signal only when the two signals are in phase; apparatus for comparing the second signal of the first pair of signals with the one of the signals of the second pair of signals which is normally out of phase therewith to produce an output signal only when the two signals are in phase; apparatus utilizing one of the output signals to lengthen the duty cycle of one of the first pair of signals of opposite phases and the other of the output signals to shorten the duty cycle of the other of the first pair of signals of opposite phases; apparatus for producing a pair of clock pulses of opposite phases each having the same frequency as the frequency of an input signal generated by a crystal oscillator; and apparatus responsive to the apparatus utilizing one of the output signals to lengthen the duty cycle of one of the first pair signals of opposite phases and the other of the output signals to shorten the duty cycle of the other of the first pair of signals of opposite phases for equalizing the duty cycle of the pair of closk pulses of opposite phases each having the same frequency as the frequency of an input signal generated by a crystal oscillator.

16 Claims, 3 Drawing Sheets

APPARATUS FOR GENERATING COMPUTER CLOCK PULSES

BACKGROUND OF THE INVENTION

1. Field of the Invention

This invention relates to computer circuits and, more particularly, to circuitry for generating computer system clock pulses.

2. History of the Prior Art

Typically, in prior art microprocessor-based computer systems, an input clock provided at a frequency controlled by a crystal oscillator is divided by two to provide symmetrical phase one and phase two clock pulses to operate the internal logic of the microprocessor. As the performance of microprocessor circuits has been pushed to ever higher frequencies, providing and distributing clock pulses resulting from a division of the crystal oscillator clock frequency by two has become more difficult. For example, a thirty-three MHz clock pulse requires an input clock frequency of sixty-six MHz from the crystal oscillator. Some of the system support logic has to operate at this sixty-six MHz frequency. Designing and manufacturing such circuitry is quite difficult and expensive. For this reason, it has been proposed that the frequency provided by the crystal oscillator be the same as the frequency for the clock pulses for the internal logic.

However, it is also advantageous that the newer designs of circuitry be based wherever possible on designs already utilized. This allows proven circuit designs to be used which are known to operate in a particular manner without idiosyncrasies; it shortens the design time and, consequently, lessens the cost of the circuitry. In order to utilize as much proven circuitry as possible, it is useful for a new microprocessor system derived from a family of microprocessors the internal circuitry of which operates two opposite phase clock pulses to continue to function in the same manner. Normally, one would expect that simply buffering the input clock frequency to generate the internal phase one and phase two signals would provide the required clock pulses. However, although the period of the clock cycle provided by a crystal clock oscillator may be very accurately determined, the duty cycle may not be so accurately determined. It has been found in practice that the duty cycle may vary by as much as five percent of the period leading to phase time variations of up to ten percent. This variation can reduce the performance of the system by the same amount.

An additional problem arises in some circuits for producing pulses at given frequencies. A two phase clock pulse generating circuit can operate in a condition producing harmonics or sub-harmonic frequencies of the pulses desired for the two phases, where the frequency of the phases is twice or just half that desired. Such a clock pulse generating circuit is not useful unless its tendency to produce harmonics or sub-harmonic frequencies of the pulses desired for the two phases can be eliminated.

SUMMARY OF THE INVENTION

It is, therefore, an object of this invention to provide circuitry for furnishing clock pulses of the same frequency as those generated by the input clock oscillator.

It is another object of this invention to provide clock pulses of the same frequency as those provided by the input clock oscillator and having a duty cycle which is very accurately determined.

It is an additional object of this invention to preclude the generation of harmonic and sub-harmonic clock pulses in circuits designed to provide clock pulses of the same frequency as those provided by an input clock oscillator.

These and other objects of the invention are realized in a circuit for generating a pair of clock pulses of opposite phases each having the same frequency as the frequency of an input signal generated by a crystal oscillator comprising means for generating first and second pairs of signals at half the frequency of the input signal generated by a crystal oscillator, the signals of each pair being of opposite phase to one another; means for comparing a first signal of the first pair of signals with the one of the signals of the second pair of signals which is normally out of phase therewith to produce an output signal only when the two signals are in phase; means for comparing the second signal of the first pair of signals with the one of the signals of the second pair of signals which is normally out of phase therewith to produce an output signal only when the two signals are in phase; means utilizing one of the output signals to lengthen the duty cycle of one of the first pair of signals of opposite phases and the other of the output signals to shorten the duty cycle of the other of the first pair of signals of opposite phases; means for producing a pair of clock pulses of opposite phases each having the same frequency as the frequency of an input signal generated by a crystal oscillator; and means responsive to the means utilizing one of the output signals to lengthen the duty cycle of one of the first pair of signals of opposite phases and the other of the output signals to shorten the duty cycle of the other of the first pair of signals of opposite phases for equalizing the duty cycle of the pair of clock pulses of opposite phases each having the same frequency as the frequency of an input signal generated by a crystal oscillator.

These and other objects and features of the invention will be better understood by reference to the detailed specification which follows taken together with the drawings in which like designations are used to refer to like elements throughout the several views.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art.

An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to method steps for operating a computer in processing electrical or other (e.g. mechanical, chemical) physical signals to generate other desired physical signals.

DETAILED DESCRIPTION OF THE INVENTION

Figure 1:
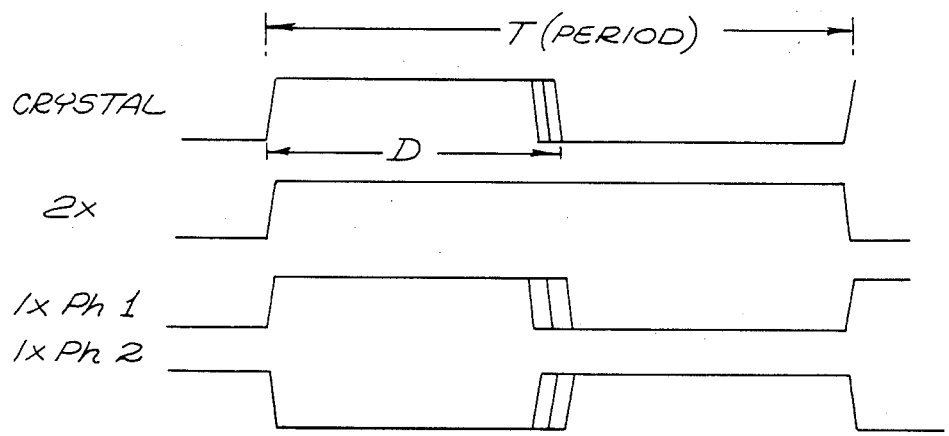
FIG. 1 illustrates a timing diagram useful in describing the problems arising from generating clock pulses at the frequency provided by an input crystal oscillator.

Referring now to FIG. 1 there is shown a timing diagram illustrating the problems arising from generating clock pulses at the frequency provided by a crystal oscillator. The timing diagram illustrates the crystal oscillator input signal, a phase one pulse generated from the input signal at one-half of the crystal oscillator frequency, and phase one and phase two clock pulses generated at the crystal oscillator frequency.

In FIG. 1, the period T of the oscillator pulse and the length of the duty cycle are illustrated. The period T of the oscillator pulse may be very accurately controlled while the length D of the duty cycle of that pulse may not be so accurately controlled. The inability to control the length of the duty cycle is due to the inability to control the exact point at which the pulse generated by the crystal oscillator falls in the swing from the positive half cycle to the negative half cycle. It has been found that this point may vary by approximately five percent of the period T. In prior art arrangements which have been able to utilize phase one and phase two clock pulses of half the frequency of the input oscillator (such the pulse shown in the second line of FIG. 2), the duty cycle may be very accurately controlled because it is measured between the beginning and end of the accurately controlled period T of the input pulse furnished by the crystal oscillator. On the other hand, where the clock pulses to be generated are controlled by the rising edge of the input clock frequency signal and the falling edge of that signal (as with the last two clock pulses shown in FIG. 1), these pulses may not be precisely determined. In fact, the length of a pulse targeted to be fifty percent of the period of the input crystal oscillator frequency may vary by plus or minus five percent of the total period T of the input clock frequency and thus by ten percent of the length of the duty cycle.

In order to improve the accuracy of the phase one and phase two clock pulses generated at the crystal oscillator frequency, a new circuit has been devised.

Figure 2:
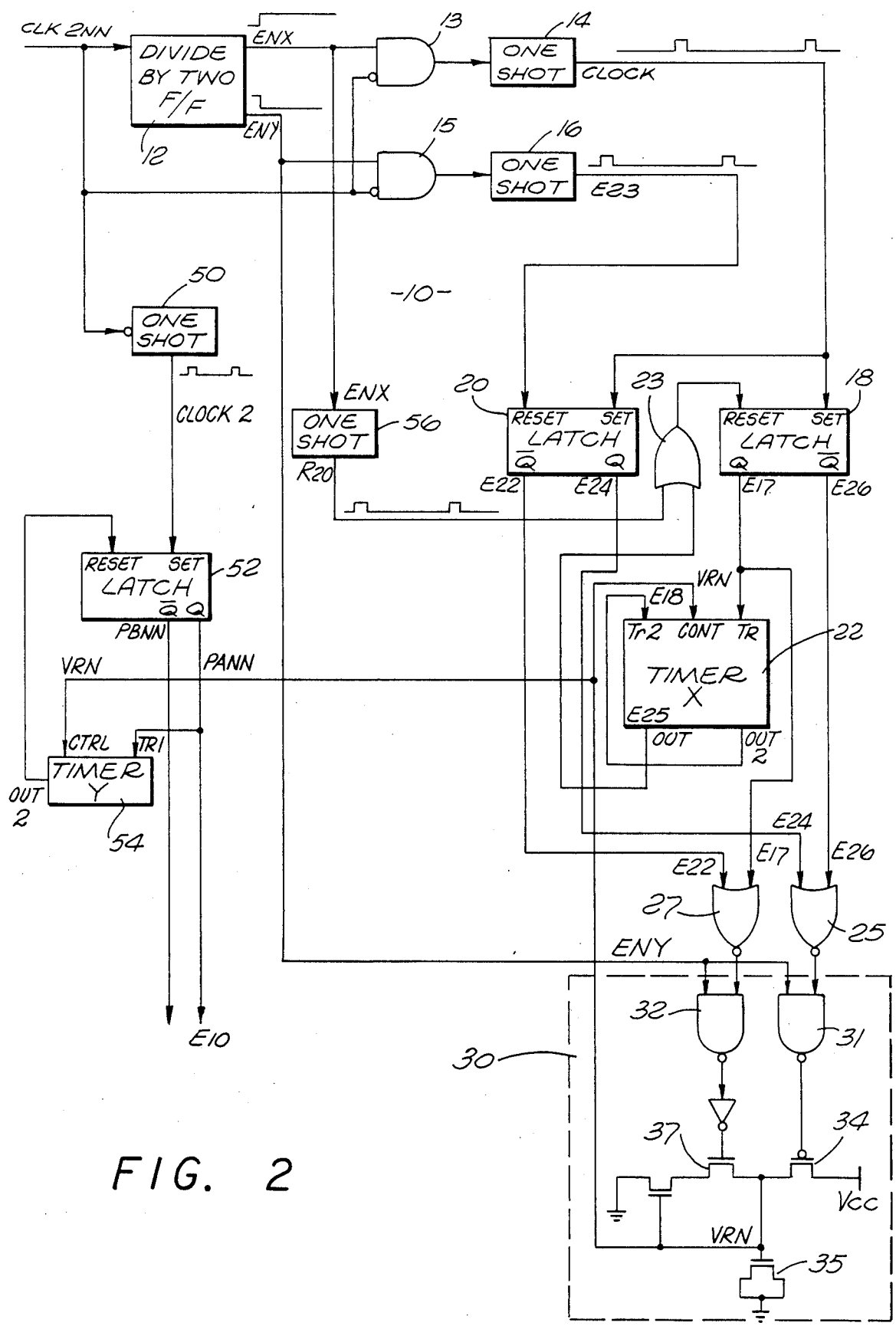
FIG. 2 illustrates a circuit in accordance with the invention which may be utilized to improve the accuracy of phase one and phase two clock pulses generated at a crystal oscillator frequency.

Referring now to FIG. 2 there is shown a partially block/partially schematic diagram of an arrangement in accordance with the invention for generating internal system clock pulses of two phases of opposite polarity, each phase having a frequency identical to the frequency provided by the external crystal oscillator circuit. The circuit 10 illustrated in FIG. 2 includes a first divide-by-two flip-flop circuit 12 of conventional construction. The circuit 12 receives an input CLK2NN which is an inverted signal derived directly from the external crystal clock oscillator and provides as output an ENX signal and an ENY signal. Because they are produced by the divide-by-two circuit 12, the ENX and ENY signals are of opposite polarity and each has a period twice as long as the clock signal CLK2NN. Thus, each of the signals ENX and ENY is of half the frequency of the input clock to the system 10.

Figure 3:
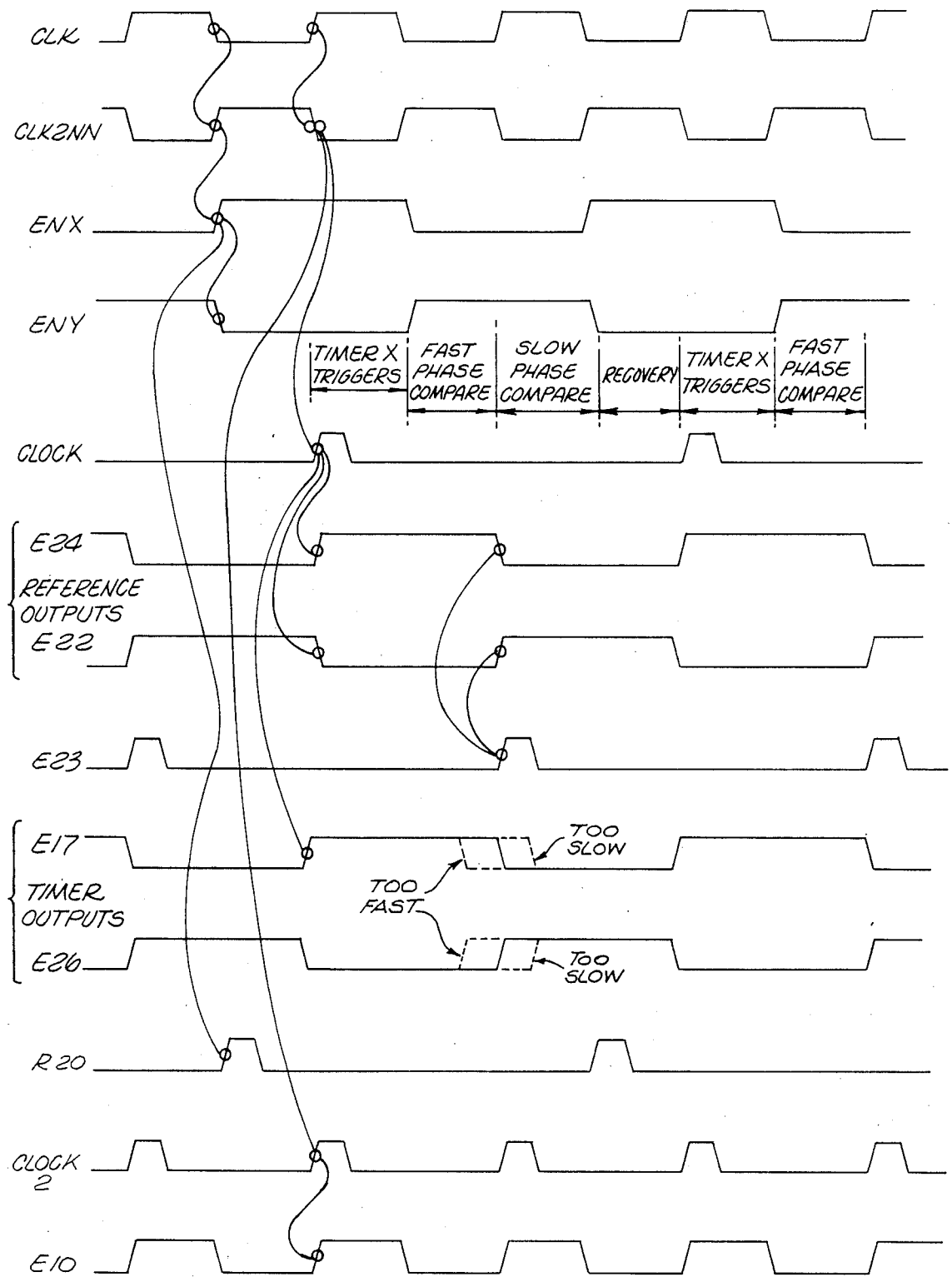
FIG. 3 illustrates a timing diagram useful in understanding the operation of the invention.

FIG. 3 is a timing diagram which describes the various signals produced in driving the circuit 10 of this invention. The signal CLK is the external crystal oscillator generated clock signal. The signal CLK2NN is the inverted clock signal furnished as input to the divide-by-two flip-flop circuit 12. The signals ENX and ENY are the output enable signals of opposite phases produced by the divide-by-two flip-flop circuit 12.

Referring again to FIG. 2, the signal ENX is furnished as input to a first one-shot pulse generator 14 via an AND gate 13 and the signal ENY is furnished as input to a second one-shot pulse generator 16 via an AND gate 15. Each of the AND gates 13 and 15 also receives as input the inverted clock signal CLK2NN. Each of the one-shot pulse generators 14 and 16 is essentially an edge detector circuit which produces a relatively narrow (approximately three nanoseconds in the preferred embodiment) pulse as output.

The output signal from the one-shot pulse generator 14 occurs during the ENX signal on the falling edge of the inverted clock CLK2NN signal and is referred to in this description of FIGS. 2 and 3 as CLOCK. The signal CLOCK is the fifth signal described in the timing diagram of FIG. 3. The output of the one-shot pulse generator 16 which is referred to in this description as signal E23 is provided during the enable period of the signal ENY on the falling edge of the inverted clock CLK2NN.

The signal CLOCK from the one-shot pulse generator 14 is furnished to a latch 18 to set that latch 18 driving an output terminal E26 negative and an output terminal E17 positive. The same signal CLOCK from the one-shot pulse generator 14 is furnished to set a second latch 20 driving an output terminal E24 thereof positive and an output terminal E22 thereof negative. The signal on terminal E17 is provided to the input of a timerX circuit 22. The circuit 22 is a voltage controlled timer having a pair of timing paths which after the completion of a prescribed delay through a first one of the paths provides a signal to a gate 23 for resetting the latch 18. The latch 20, on the other hand is reset by the signal E23 provided by the one-shot pulse generator 16.

The output signals from the latch 18 are provided to NOR gates 25 and 27 which also receive inputs from the terminals E24 and E22 of the latch 20. These gates 25 and 27 compare the two signals provided thereto, a first from the latch 18 and a second from the latch 20 and provide signals to a phase detector arrangement 30 for varying the control voltage applied to the timerX circuit 22 depending on whether the timerX circuit 22 is running too fast or too slow. The phase detector 30 includes a pair of NAND gates 31 and 32 which are also provided input by the signal ENY from the divide-by-two flip-flop 12 and therefore are enabled only when the signal ENY is high. This arrangement provides that the input to the phase detector will only take place during the positive portion of the signal ENY or only on every other clock cycle. After the positive portion of the signal ENY, the phase detector rests for a full clock cycle thereby providing sufficient time for the control circuitry to recover. This provides a positive identification as to whether the circuitry is operating to provide the appropriate frequency clock signal rather than a harmonic or subharmonic thereof. Because of this arrangement, it is impossible for the circuitry of this invention to generate either a harmonic or subharmonic of the desired input clock frequency.

If the timerX circuit is providing too long of a delay for resetting the latch 18, the the signal E17 and the signal E26 at the output of the latch 18 would be extended as shown in FIG. 3 to the "too slow" range. In the "too slow" range, the signal E17 and the signal E22 will both be positive at the same time while the signals E24 and E26 furnished to the NOR gate 25 will both be negative at the same time. This will cause an NAND gate 31 to provide a signal for operating a P type transistor 34 in the phase detector circuit 30 and provide a voltage VCC for charging a capacitor 35. Alternatively, if the timerX circuit 22 is operating too rapidly and providing insufficient delay at the output timerX circuit 22, the signals E17 and E22 coinciding at the NOR gate 27 will provide a pulse during the period of the positive-going cycle of the signal ENY to the NAND gate 32 to operate an N transistor 37 to discharge the capacitor 35.

The voltage on the capacitor 35 is utilized to provide a voltage signal VRN at the input of the timerX circuit 22 for controlling the delay furnished by that circuit 22.

As may be seen from the timing diagram of FIG. 3, if the duty cycle of either signal E17 or E26 varies from the duty cycle produced by the latch 20 for signals E22 and E24, then one or the other of the two gates 25 or 27 will have furnished at its input a pair of signals to operate that gate. If the system is running too fast so that the duty cycle of E17 is too short, then E17 will have gone negative during the continuance of the negative phase of signal E22. This will provide a signal from gate 27 to the phase detector circuit 30 to indicate that the timerX circuit 22 is running too fast. Alternatively, if the circuit 22 is running too slow and the duty cycle of signal E17 is too long, then the signals E26 and E24 will both be low at the same time. This will cause a signal to be transmitted by gate 25 to the phase detector circuit 30 for slowing the timerX circuit 22.

In this manner, the gates 25 and 27 compare the lengths of the two opposite phases generated at the latches 18 and 20 to assure that those opposite phases are of the same length. That is, the signal E17 at the Q terminal of the latch 18 is compared with the signal E22 at the $\overline{Q}$ terminal of the latch 20 and the signal E24 at the Q terminal of the latch 20 is compared with the signal E26 at the $\overline{Q}$ terminal of the latch 18. This comparing of alternate phases to one another forces the voltage on the capacitor 35 to be such that the timerX circuit 22 produces a delay so that each phase is forced to a duty cycle that it is exactly the length of the duty cycle of the opposite phase so that simultaneous inputs are not present at either gate 25 or 27. Thus, the clock pulse has a fifty percent duty cycle because the two halves of timerX circuit 22 are identical. In this manner, the circuit 10 operates to produce identical duty cycles for opposite phase clock pulses having the same frequency as the input clock signal produced by the crystal oscillator.

Figure 4:
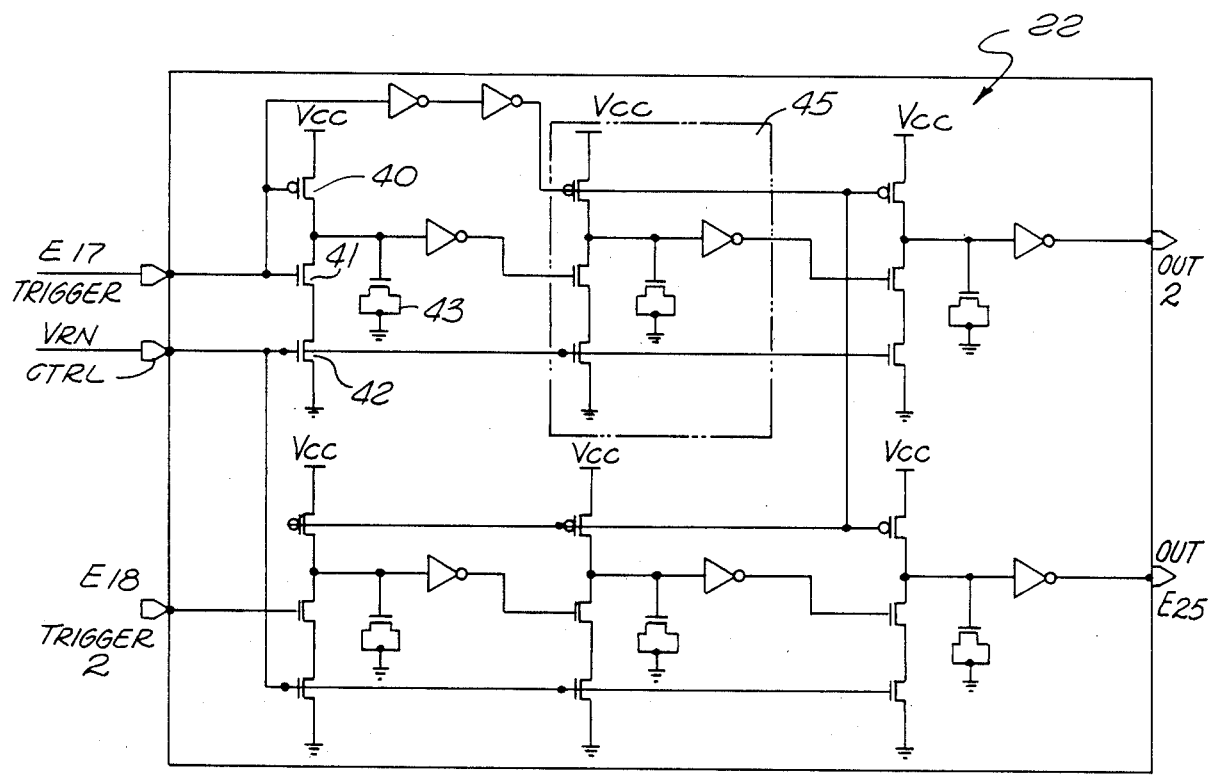
FIG. 4 is a circuit diagram illustrating in more detail a portion of the circuitry for implementing the arrangement shown in the block diagram in FIG. 2.

FIG. 4 illustrates the circuit of the timerX circuit 22 for accomplishing the voltage controlled delay. The circuit 22 has two individual channels of delay. The first input signal E17 is provided to a first delay stage including a P type transistor 40 serially connected with an N type transistor 41 and a second N type transistor 42. The signal E17 acts as a trigger to begin the delay furnished by the circuit 22. The control voltage VRN is provided at a control terminal CTRL and controls the amount of current flowing through the transistor 42. The transistor 42 and the transistor 41 provide a discharge path for a capacitor 43, the discharge of which controls the firing of the next stage 45 of the timer circuit 22. In operation, the capacitor which times each stage (such as the capacitor 43 in the first stage) is precharged through the P type device 40 during the low condition of the trigger signal. When the trigger signal goes high, it operates the N device to provide a path for discharge of the capacitor timing that stage. The amount of control voltage VRN applied to the gate of the control N device (device 42) determines the degree of the discharge of the timing capacitor such as capacitor 43.

It will be understood by those skilled in the art that when the capacitor 43 reaches the required level of discharge, the next stage is triggered and that succeeding stage 45 (and the stages following) likewise triggers the next stage when an appropriate delay has taken place. After the operation of the first three stages of the timer circuit 22, an output is provided at terminal OUT2 which is fed back as input to the TRIGGER2 terminal of the circuit 22 to provide for a second matched delay through the second half of the timer circuit 22. The output of the second half of the timer circuit 22 at terminal E25 is furnished as explained at the gate 23 to reset the latch 18 thereby controlling the length of the pulses E17 and E26 precisely to furnish both fast phase comparison and slow phase comparison for controlling the voltage VRN.

In view of the fact that the signals provided by the circuits heretofore described are operating at a frequency one-half of the clock oscillator frequency and are therfore not appropriate to drive the internal clock of the system, a third one-shot pulse generator 50 is provided. The pulse generator 50 receives as input the inverted clock signal CLK2NN and the enable signal and provides a positive-going pulse signal CLOCK2 coincident with the positive-going phase of the signals provided by the external crystal oscillator. These signals are at the same frequency as the signals provided by the crystal oscillator since a divide-by-two flip-flop is not included in this portion of the circuitry.

The output of the generator 50 is furnished to a latch 52 as a setting signal. A reset signal to the latch 52 is provided from a timerY circuit 54 which receives a control input from the phase detector output control voltage VRN. The timerY circuit 54 is identical to the timerX circuit 22 illustrated in FIG. 4 and provides an output at its OUT2 terminal for resetting the latch 52.

Since the OUT2 terminal utilizes only three stages of delay through the timerY circuit 54, the latch 52 is reset twice as rapidly as is the latch 18. The latch 52 provides at its two output terminals Q and $\bar{Q}$ the two phase output signals PANN and PBNN utilized as internal system clocks in accordance with the present invention. These two signals are inverted from the signals provided by the latch 52. The output signal PBNN of the latch 52 is utilized as the trigger1 input signal to the timerY circuit 54 for initiating the delay in that timer circuit.

It will be recognized by those skilled in art that the circuit of the present invention provides for comparison between the output signals provided by the latch 18 and the latch 20. Since the reset of the latch 18 is controlled by the duration of the timerX circuit 22 the two halves of which are identical, while the reset of the latch 20 is controlled by the reference signals produced by the one-shot pulse generator 16, comparison of the two signals produced by each of the latches 18 and 20 will clearly distinguish whether the delay produced by the timer circuit 20 is too long or too short and will provide the correct input for charging or discharging the capacitor 35 to determine the control voltage VRN. Since the control voltage VRN controls not only the delay provided by the timerX circuit 22, but the delay provided by the timerY circuit 54 (which is essentially identical circuitry to timerX 22) which ultimately controls the two phase clock signals produced by the latch 22, the precise and correct control of the output signals PANN and PBNN and the length of the duty cycle of each is also provided.

An additional advantage of the present invention is provided by a fourth one-shot pulse generator 56 which receives as an input the enabling signal ENX from the divide-by-two flip-flop 12 and provides a narrow positive going pulse signal R20 to the gate 23. This pulse, since it is derived from the signal ENX, is at one-half the crystal oscillator frequency and thus occurs at every other positive going swing of the inverted clock CLK2NN. This signal allows the complete reset of the timer circuitry by providing a reset pulse at the gate 23 which overrides any exceptionally long delay at the output of the timerX circuit 22. Consequently, if more than two clock periods have occurred, the latch 18 will be reset. This might occur either because the timerX circuit 22 is just starting up or because the signal VRN on the capacitor 35 is so far off that the discharge of the timing capacitors of the timer circuit 22 is taking place much too slowly. Such a case occurs on start up of the circuit 10 of the present invention and when the timer circuit 22 is generating much too long a delay.

Although the invention has been described with reference to particular arrangements and systems, it will be apparent to those skilled in the art that the details of those arrangements and systems are used for illustrative purposes only and should not be taken as limitations of the invention. It is, thus, to be contemplated that many changes and modifications may be made by those of ordinary skill in the art without departing from the scope and spirit of the invention. The invention should, therefore, be considered to be described only in terms of claims which follow.

What is claimed is:

1. A circuit for generating a pair of clock pulses of opposite phases each having the same frequency as the frequency of an input signal generated by a crystal oscillator comprising means for generating a first pair of signals of opposite phases at half the frequency of the input signal generated by a crystal oscillator, means for generating a second pair of signals of opposite phases at half the frequency of the input signal generated by a crystal oscillator, means for comparing a first one of the first pair of signals with the one of the signals of the second pair of signals which is normally out of phase therewith to produce an output signal only when the two signals are in phase, means for comparing a second one of the first pair of signals with the one of the signals of the second pair of signals which is normally out or phase therewith to produce an output signal only when the two signals are in phase, means utilizing one of the output signals to lengthen the duty cycle of one of the first pair of signals of opposite phases and the other of the output signals to shorten the duty cycle of the other of the first pair of signals of opposite phases, means for producing a pair of clock pulses of opposite phases each having the same frequency as the frequency of an input signal generated by a crystal oscillator, and means responsive to the means utilizing one of the output signals to lengthen the duty cycle of one of the first pair of signals of opposite phases and the other of the output signals to shorten the duty cycle of the other of the first pair of signals of opposite phases for varying the duty cycle of the pair of clock pulses of opposite phases each having the same frequency as the frequency of an input signal generated by a crystal oscillator.

2. A circuit for generating a pair of clock pulses of opposite phases each having the same frequency as the frequency of an input signal generated by a crystal oscillator as claimed in claim 1 in which the means for generating a first pair of signals of opposite phases at half the frequency of the input signal generated by a crystal oscillator comprises first means for furnishing a pulse in response to alternate pulses generated by the crystal oscillator, and a first latch circuit for producing a pair of output signals in response to the pulses; and in which the means for generating a second pair of signals of opposite phases at half the frequency of the input signal generated by a crystal oscillator comprises second means for furnishing a pulse in response to the alternate pulses generated by the crystal oscillator not utilized by the means for generating a pulse, and a second latch circuit for producing a pair of output signals in response to the pulses.

3. A circuit for generating a pair of clock pulses of opposite phases each having the same frequency as the frequency of an input signal generated by a crystal oscillator as claimed in claim 1 in which means for comparing a first one of the first pair of signals with the one of the signals of the second pair of signals which is normally out of phase therewith to produce an output signal only when the two signals are in phase comprises a first NOR gate, and the means for comparing a second one of the first pair of signals with the one of the signals of the second pair of signals which is normally out of phase therewith to produce an output signal only when the two signals are in phase comprises a second NOR gate.

4. A circuit for generating a pair of clock pulses of opposite phases each having the same frequency as the frequency of an input signal generated by a crystal oscillator as claimed in claim 1 in which the means utilizing one of the output signals to lengthen the duty cycle of one of the first pair of signals of opposite phases and the other of the output signals to shorten the duty cycle of the other of the first pair of signals of opposite phases comprises phase detector means, and timing means operating in response to the phase detector means for controlling the duty cycle of the first pair of signals.

5. A circuit for generating a pair of clock pulses of opposite phases each having the same frequency as the frequency of an input signal generated by a crystal oscillator as claimed in claim 4 in which the phase detector means comprises a capacitor, means for charging the capacitor in response to a first one of the first pair of signals and the one of the signals of the second pair of signals which is normally out of phase therewith being in phase, and means for discharging the capacitor in response to the second one of the first pair of signals and the one of the signals of the second pair of signals which is normally out of phase therewith being in phase.

6. A circuit for generating a pair of clock pulses of opposite phases each having the same frequency as the frequency of an input signal generated by a crystal oscillator as claimed in claim 4 in which the timing means operating in response to the phase detector comprises means for controlling the duty cycle of the first pair of signals is voltage controlled delay circuit.

7. A circuit for generating a pair of clock pulses of opposite phases each having the same frequency as the frequency of an input signal generated by a crystal oscillator as claimed in claim 1 in which the means for producing a pair of clock pulses of opposite phases each having the same frequency as the frequency of an input signal generated by a crystal oscillator a third pulse generating circuit, and latch means responsive to signals produced by the third pulse generator for producing a pair of output signals.

8. A circuit for generating a pair of clock pulses of opposite phases each having the same frequency as the frequency of an input signal generated by a crystal oscillator as claimed in claim 1 in which the means for varying the duty cycle of the pair of clock pulses of opposite phases each having the same frequency as the frequency of an input signal generated by a crystal oscillator comprises a timing circuit operating in response to the means utilizing one of the output signals to lengthen the duty cycle of one of the first pair of signals of opposite phases and the other of the output signals to shorten the duty cycle of the other of the first pair of signals of opposite phases.

9. A circuit for generating a pair of clock pulses of opposite phases each having the same frequency as the frequency of an input signal generated by a crystal oscillator comprising means for generating first and second pairs of signals at half the frequency of the input signal generated by a crystal oscillator, the signals of each pair being of opposite phase to one another; means for comparing a first signal of the first pair of signals with the one of the signals of the second pair of signals which is normally out of phase therewith to produce an output signal only when the two signals are in phase; means for comparing the second signal of the first pair of signals with the one of the signals of the second pair of signals which is normally out of phase therewith to produce an output signal only when the two signals are in phase; means utilizing one of the output signals to lengthen the duty cycle of one of the first pair of signals of opposite phases and the other of the output signals to shorten the duty cycle of the other of the first pair of signals of opposite phases; means for producing a pair of clock pulses of opposite phases each having the same frequency as the frequency of an input signal generated by a crystal oscillator; and means responsive to the means utilizing one of the output signals to lengthen the duty cycle of one of the first pair of signals of opposite phases and the other of the output signals to shorten the duty cycle of the other of the first pair of signals of opposite phases for equalizing the duty cyclye of the pair of clock pulses of opposite phases each having the same frequency as the frequency of an input signal generated by a crystal oscillator.

10. A circuit for generating a pair of clock pulses of opposite phases each having the same frequency as the frequency of an input signal generated by a crystal oscillator as claimed in claim 9 in which the means for generating first and second pairs of signals at half the frequency of the input signal generated by a crystal oscillator, the signals of each pair being of opposite phase to one another, comprises first means for furnishing a pulse in response to alternate pulses generated by the crystal oscillator, a first latch circuit for producing a pair of output signals in response to the pulses, second means for furnishing a pulse in response to the alternate pulses generated by the crystal oscillator not utilized by the means for generating a pulse, and a second latch circuit for producing a pair of output signals in response to the pulses.

11. A circuit for generating a pair of clock pulses of opposite phases each having the same frequency as the frequency of an input signal generated by a crystal oscillator as claimed in claim 9 in which the means for comparing a first signal of the first pair of signals with the one of the signals of the second pair of signals which is normally out of phase therewith to produce an output signal only when the two signals are in phase comprises a first NOR gate, and the means for comparing the second signal of the first pair of signals with the one of the signals of the second pair of signals which is normally out of phase therewith to produce an output signal only when the two signals are in phase comprises a second NOR gate.

12. A circuit for generating a pair of clock pulses of opposite phases each having the same frequency as the frequency of an input signal generated by a crystal oscillator as claimed in claim 9 in which the means utilizing one of the output signals to lengthen the duty cycle of one of the first pair of signals of opposite phases and the other of the output signals to shorten the duty cycle of the other of the first pair of signals of opposite phases comprises phase detector means, and timing means operating in response to the phase detector means for controlling the duty cycle of the first pair of signals.

13. A circuit for generating a pair of clock pulses of opposite phases each having the same frequency as the frequency of an input signal generated by a crystal oscillator as claimed in claim 12 in which the phase detector means comprises a capacitor, means for charging the capacitor in response to a first one of the first pair of signals and the one of the signals of the second pair of signals which is normally out of phase therewith being in phase, and means for discharging the capacitor in response to the second one of the first pair of signals and the one of the signals of the second pair of signals which is normally out of phase therewith being in phase.

14. A circuit for generating a pair of clock pulses of opposite phases each having the same frequency as the frequency of an input signal generated by a crystal oscillator as claimed in claim 13 in which the timing means operating in response to the phase detector means for controlling the duty cycle of the first pair of signals is a voltage controlled delay circuit.

15. A circuit for generating a pair of clock pulses of opposite phases each having the same frequency as the frequency of an input signal generated by a crystal oscillator as claimed in claim 9 in which the means for producing a pair of clock pulses of opposite phases each having the same frequency as the frequency of an input signal generated by a crystal oscillator comprises a third pulse generating circuit, and latch means responsive to signals produced by the third pulse generator for producing a pair of output signals.

16. A circuit for generating a pair of clock pulses of opposite phases each having the same frequency as the frequency of an input signal generated by a crystal oscillator as claimed in claim 9 in which the means for equalizing the duty cycle of the pair of clock pulses of opposite phases each having the same frequency as the frequency of an input signal generated by a crystal oscillator comprises a timing circuit operating in response to the means utilizing one of the output signals to lengthen the duty cycle of one of the first pair of signals of opposite phases and the other of the output signals to shorten the duty cycle of the other of the first pair of signals of opposite phases.

* * * * *